(12) United States Patent
Kim et al.

(10) Patent No.: US 8,476,959 B2
(45) Date of Patent: Jul. 2, 2013

(54) RADIO FREQUENCY SWITCH CIRCUIT

(75) Inventors: Yu Sin Kim, Daejeon (KR); Youn Suk Kim, Gyunggi-do (KR); Dong Hyun Baek, Seoul (KR); Sun Woo Yoon, Seoul (KR)

(73) Assignees: Samsung Electro-Mechanics Co., Ltd. (KR); Korea Advanced Institute of Science and Technology (KR)

( * ) Notice: Subject to any disclaimer, the term of this patent is extended or adjusted under 35 U.S.C. 154(b) by 164 days.

(21) Appl. No.: 13/016,499

(22) Filed: Jan. 28, 2011

(65) Prior Publication Data

US 2011/0187475 A1    Aug. 4, 2011

(30) Foreign Application Priority Data

Feb. 1, 2010   (KR) .................. 10-2010-0009125

(51) Int. Cl.
*H03K 17/00* (2006.01)
*H01L 25/00* (2006.01)

(52) U.S. Cl.
USPC .......................................... 327/365; 327/565

(58) Field of Classification Search
USPC .................. 327/365, 376, 377, 427, 564, 565
See application file for complete search history.

(56) References Cited

U.S. PATENT DOCUMENTS

| | | | |
|---|---|---|---|
| 5,818,099 A * | 10/1998 | Burghartz | 257/548 |
| 6,094,088 A * | 7/2000 | Yano | 327/534 |
| 6,169,311 B1 | 1/2001 | Iwasaki | |
| 7,030,591 B2 * | 4/2006 | Stellberger | 320/134 |
| 7,890,063 B2 * | 2/2011 | Ahn et al. | 455/78 |
| 8,058,922 B2 * | 11/2011 | Cassia | 327/534 |
| 2008/0272824 A1 | 11/2008 | Fu et al. | |

FOREIGN PATENT DOCUMENTS

| | | |
|---|---|---|
| KR | 10-2001-0021489 A | 3/2001 |
| KR | 20080050325 A | 6/2008 |

OTHER PUBLICATIONS

Korean Office Action 10-2010-0009125 issued Aug. 23, 2011.

* cited by examiner

*Primary Examiner* — Hai L Nguyen

(74) *Attorney, Agent, or Firm* — Lowe Hauptman Ham & Berner, LLP

(57) ABSTRACT

An RF switch circuit includes an RF switch including a first NMOS switch formed on a chip substrate, a switch controller including a second NMOS switch and a PMOS switch formed on the substrate, for controlling the RF switch, and a limiter including a deep N-type well diode formed on the substrate, for limiting an RF signal level transferred from the RF switch to the switch controller through the substrate. The first NMOS switch includes a first N-type terminal formed on a deep N-type well substrate formed on the substrate, for receiving a driving power through a first floating resistor, a P-type terminal for receiving a body power through a second floating resistor, and two second N-type terminals for receiving a gate power through a third floating resistor. The P-type and two second N-type terminals are formed on a P-type substrate formed on the deep N-type well substrate.

7 Claims, 7 Drawing Sheets

RADIO FREQUENCY SWITCH CIRCUIT

CROSS-REFERENCE TO RELATED APPLICATIONS

This application claims the priority of Korean Patent Application No. 10-2010-0009125 filed on Feb. 1, 2010, in the Korean Intellectual Property Office, the disclosure of which is incorporated herein by reference.

BACKGROUND OF THE INVENTION

1. Field of the Invention

The present invention relates to a radio frequency (RF) switch circuit and, more particularly, to an RF switch circuit for restraining an input signal input to the RF switch from being transferred to a switch controller when floating resistors are connected to an NMOS FET and a PMOS FET of the RF switch and those of the switch controller formed through a standard CMOS (Complementary Metal Oxide Semiconductor) process.

2. Description of the Related Art

Recently, wireless communication terminals have been widely used thanks to the convenience of their use. Wireless communication terminals may employ an RF switch circuit in order to change a transmission path of an RF signal.

The RF switch circuit may include an RF switch for changing a signal path and a controller for controlling the RF switch.

The RF switch circuit has largely been made of compound semiconductor such as SOS (Silicon on Sapphire), SOI (Silicon on Insulator) or gallium-arsenide (GaAs), but recently, due to an increase in the fabrication cost and a CMOS (Complementary Metal Oxide Semiconductor) process and circuit design technique development, the RF switch circuit is increasingly fabricated through the CMOS process.

However, the CMOS process is disadvantageous in that an insertion loss increases due to high parasitic capacitance, and because a breakdown voltage is low, if the power of an input signal to the RF switch is large, the insertion loss further increases and linearity deteriorates.

In an effort to solve this problem, a floating resistor is connected to an N type substrate of an NMOS FET (N type Metal Oxide Semiconductor Field Effect Transistor) and a PMOS FET (P type Metal Oxide Semiconductor Field Effect Transistor) of the switch controller, but in this case, a signal input to the RF switch is transferred to the switch controller to interfere with a stable operation of the switch controller.

SUMMARY OF THE INVENTION

An aspect of the present invention provides a radio frequency (RF) switch circuit for restraining an input signal input to the RF switch from being transferred to a switch controller when floating resistors are connected to an NMOS FET and a PMOS FET of the RF switch and those of the switch controller formed through a standard CMOS (Complementary Metal Oxide Semiconductor) process.

According to an aspect of the present invention, there is provided an RF switch circuit including: an RF switch having at least one NMOS (N type Metal. Semiconductor) switch formed on a single chip substrate and changing a transmission path of an RF signal; a switch controller having at least one NMOS switch and at least one PMOS (P type Metal Oxide Semiconductor) formed on the chip substrate and controlling changing of a path of the RF switch; and a limiter having a deep N type well diode formed on the chip substrate and limiting the level of an RF signal transferred from the RF switch to the switch controller, wherein the NMOS switch of the RF signal receives corresponding power through a floating resistor, and the at least one NMOS switch and at least one PMOS switch of the switch controller receive corresponding power through a floating resistor.

The NMOS switch of the RF switch may include an N type terminal formed on a first deep N type well substrate formed on the chip substrate and receiving driving power through a floating resistor and a P type terminal receiving body power through a floating resistor and two N type terminals receiving gate power through a floating resistor, the P type terminal and the two N type terminals being formed on a first P type substrate formed on the first deep N type well substrate.

The NMOS switch of the switch controller may have an N type terminal formed on a second deep N type well substrate formed on the chip substrate and receiving driving power through a floating resistor, and a P type terminal and two N type terminals formed on a second P type substrate formed on the second deep N type well substrate, and the PMOS switch of the switch controller may have two P type terminals formed on the first N type substrate formed on the chip substrate and an N type terminal receiving driving power through a floating resistor.

The deep N type well diode of the limiter may include an N type terminal formed on a third deep N type well substrate formed on the Chip substrate and receiving driving power through a floating resistor, and a P type terminal formed on a third P type substrate formed on the third deep N type well substrate and having a first capacitor connected with a ground through a first floating resistor and connected in parallel with the first floating resistor and an N type terminal formed on the third P type substrate formed on the third deep N type well substrate and having a second capacitor receiving driving power through a second floating resistor and connected between the second floating resistor and a ground.

The switch controller may include: an oscillator providing a reference signal; a charge pump converting a voltage level of the reference signal transferred from the oscillator; a decoder decoding a control bit transferred from an external source; and a level shifter shifting the level of the voltage which has been converted by the charge pump according to a decoded signal transferred from the decoder and providing the level-shifted voltage to the RF switch, wherein the oscillator, the charge pump, the decoder, and the level shifter include at least one NMOS switch and at least one PMOS switch, respectively.

The at least one NMOS switch of the RF switch may be an N-channel MOS FET formed through a standard PMOS process.

The at least one NMOS switch and at least one PMOS switch of the switch controller may be an N-channel MOS FET and a P-channel MOS FET formed through a standard CMOS process, respectively.

The deep N type well diode of the limiter may be formed through the standard CMOS process.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
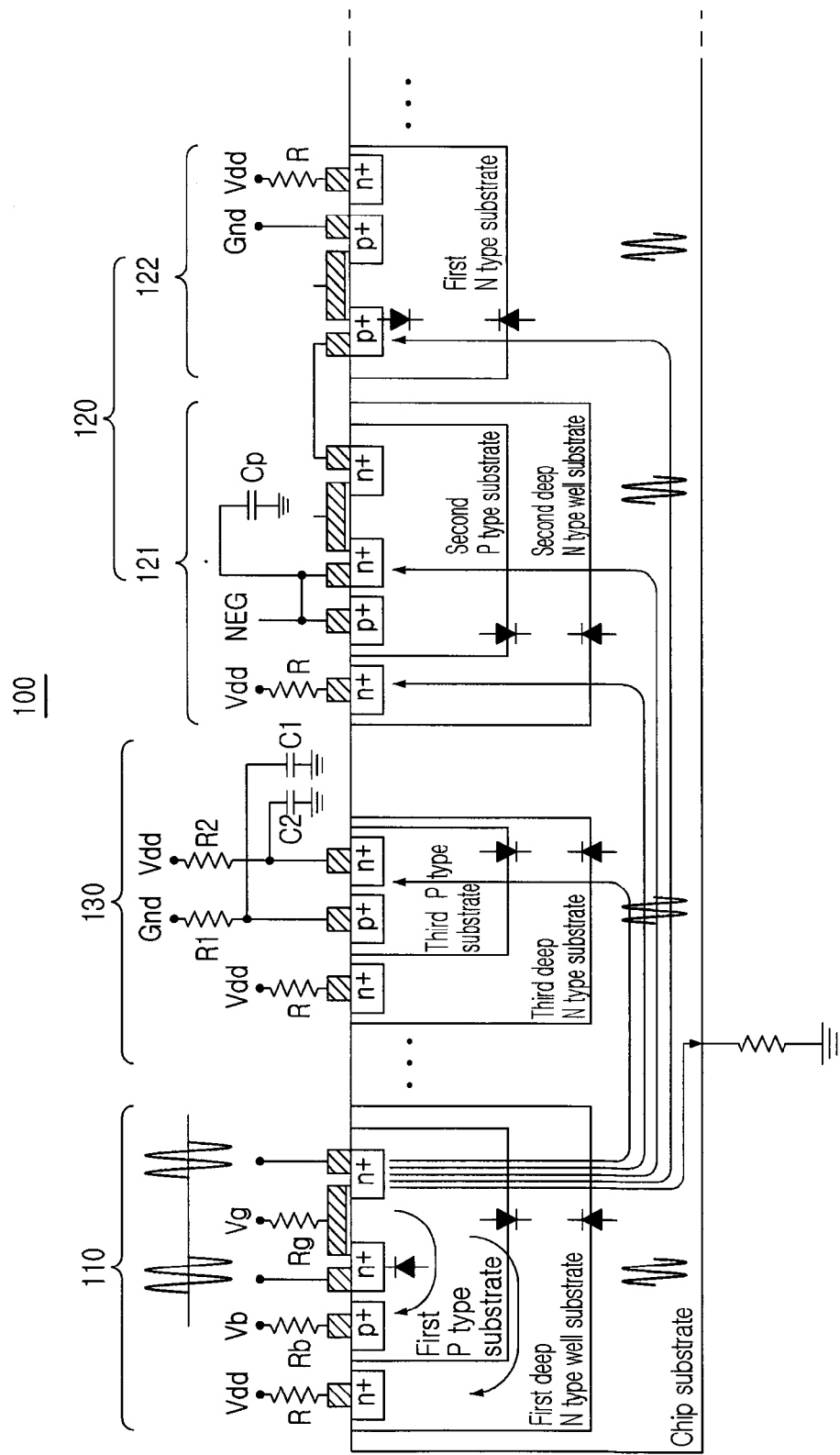
FIG. 1 illustrates the configuration of an RF switch circuit formed on a single substrate according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 illustrates the configuration of an RF switch circuit formed on a single substrate according to an exemplary embodiment of the present invention.

With reference to FIG. 1, an RF switch circuit 100 may be formed on a single substrate. Viewed from the section of the RF switch circuit 100, the RF switch circuit 100 includes at least one N type MOSFET (Metal Oxide Semiconductor Field-Effect Transistor) provided at an RF switch 110, and at least one N type MOSFET 121 and at least one P type MOSFET 122 provided at a switch controller 120.

The at least one N type MOSFET provided at the RF switch 110 and the at least one N type MOSFET 121 and at least one P type MOSFET 122 provided at the switch controller 120 may be formed on the single substrate through a standard CMOS process.

The at least one N type MOSFET provided at the RF switch 110 may include an N type terminal formed on a first deep N type well substrate formed on a chip substrate, and a P type terminal and two N type terminals formed on a first P type substrate formed on the first deep N type well substrate.

The N type terminal formed on the first deep N type well substrate and the P type terminal and two N type terminals formed on the first P type substrate are connected with floating resistors R, Rb, and Rg. The N type terminal formed on the first deep N type well substrate may receive driving power Vdd through the floating resistor R, the P type terminal formed on the first P type substrate may receive body power Vb through the floating resistor Rb, and the two N type terminals formed on the first P type substrate may receive gate power Vg through the floating resistor Rg.

The at least one N type MOSFET 121 provided at the switch controller 120 may include an N type terminal formed on a second deep N type well substrate formed on the chip substrate, and a P type terminal and two N type terminals formed on a second P type substrate formed on the second deep N type well substrate. The N type terminal formed on the second deep N type well substrate may receive driving power Vdd through a floating resistor R.

The at least one P type MOSFET 122 provided at the switch controller 120 may include two P type terminals and one N type terminal formed on a first N type substrate formed on the chip substrate. The one N type terminal formed on the first N type substrate may receive driving power Vdd through a floating resistor (R).

A deep N type well diode provided at a limiter 130 may include an N type terminal formed on a third deep N type well substrate formed on the chip substrate, and a P type terminal and an N type terminal formed on a third P type substrate formed on the third deep N type well substrate.

The N type terminal formed on the third deep N type well substrate may receive driving power Vdd through a floating resistor (R), and the P type terminal and the N type terminal formed on the third P type substrate may be connected with a ground Gnd or receive driving power Vdd through first and second floating resistors R1 and R2, respectively. The first and second floating resistors R1 and R2 may be connected with first and second capacitors C1 and C2. The first capacitor C1 may be connected in parallel with the first floating resistor R1 so as to be connected with the ground, and the second capacitor C2 may be connected with the second floating resistor so as to receive the driving power Vdd. Accordingly, the P type terminal formed on the third P type substrate may be connected with the first floating resistor R1 and the first capacitor C1, and the N type terminal formed on the third P type substrate may be connected with the second floating resistor R2 and the second capacitor C2.

Although not shown in FIG. 1, the limiter 130 may be formed to surround the switch controller 120.

Figure 2:
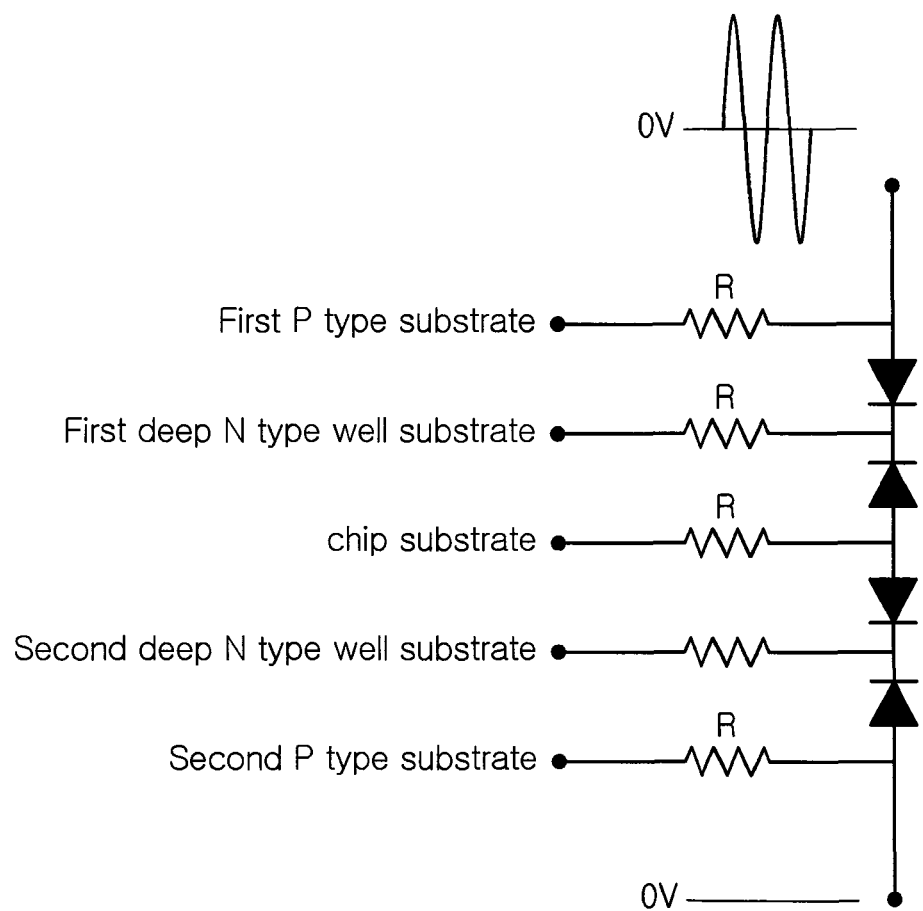
FIG. 2 is an equivalent circuit diagram of the RF switch circuit according to an exemplary embodiment of the present invention.

FIG. 2 is an equivalent circuit diagram of the RF switch circuit according to an exemplary embodiment of the present invention.

With reference to FIGS. 1 and 2, an input signal may be input to the RF switch 110 of the RF switch circuit 100 according to an exemplary embodiment of the present invention, and the input signal may be transferred to the switch controller 120 through the substrates.

Namely, as shown in FIG. 2, the input signal may be input to the N type terminal formed on the first P type substrate of the RF switch 110, which may be transferred to each substrate through a bulk diode of the P-N junction substrates. In this case, however, the floating resistors R, Rb, and Rg connected to each terminal may restrain the input signal from being transferred to the substrates. Thus, even when the input signal having a high power level is input, the RF switch 110 and the switch controller 120 formed through the standard CMOS process having a low breakdown voltage can operate normally.

That is, the withstanding voltage of the RF switch 110 by the foregoing bulk diode can be expressed by Equation (1) shown below:

[Equation 1]

$$VMAX=2*(VDO+Vdd)+1*(VDBR-Vdd)+2*Vneg$$

(Where VMAX is a withstanding voltage, VDO is a drop voltage of the bulk diode, Vdd is driving power, VDBR is a breakdown voltage of the bulk diode, and Vneg is a charge pump voltage of the switch controller).

In general, when the bulk diode is formed according to a 0.18 um process, the withstanding voltage of the RF switch 110 may be substantially 25.4V.

Accordingly, a power level at which linearity can be maintained may be 38 dBm.

Figure 3:
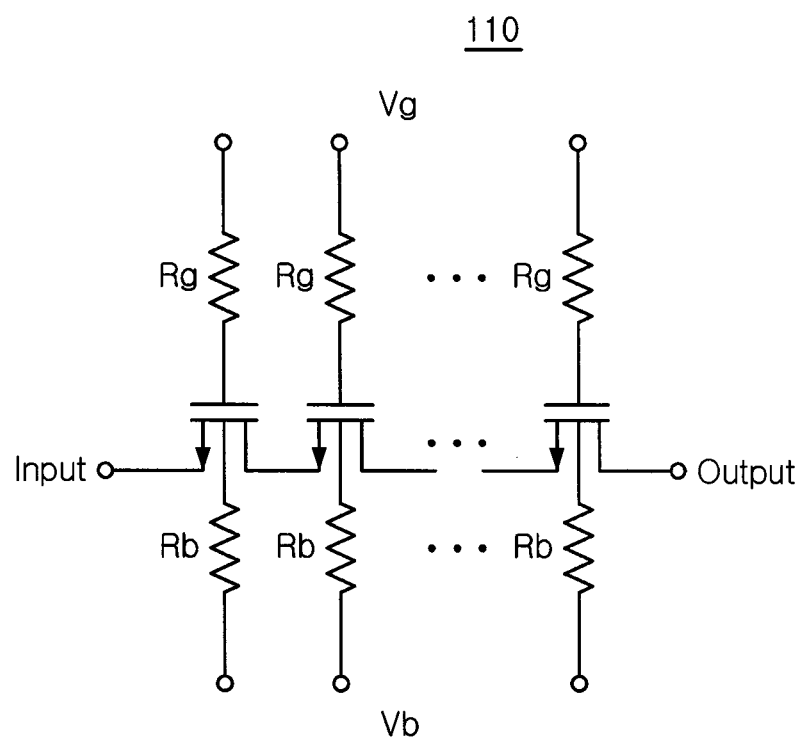
FIG. 3 is a view schematically showing the configuration of an RF switch employed in the RF switch circuit according to an exemplary embodiment of the present invention.

FIG. 3 is a view schematically showing the configuration of an RF switch employed in the RF switch circuit according to an exemplary embodiment of the present invention.

As shown in FIG. 3, the RF switch 110 may include a plurality of N type MOSFETs connected in parallel. Bodies and gates of the plurality of N type MOSFETs may be connected with the floating resistors Rb and Rg so as to receive the body power Vd or the gate power Vg.

Figure 4:
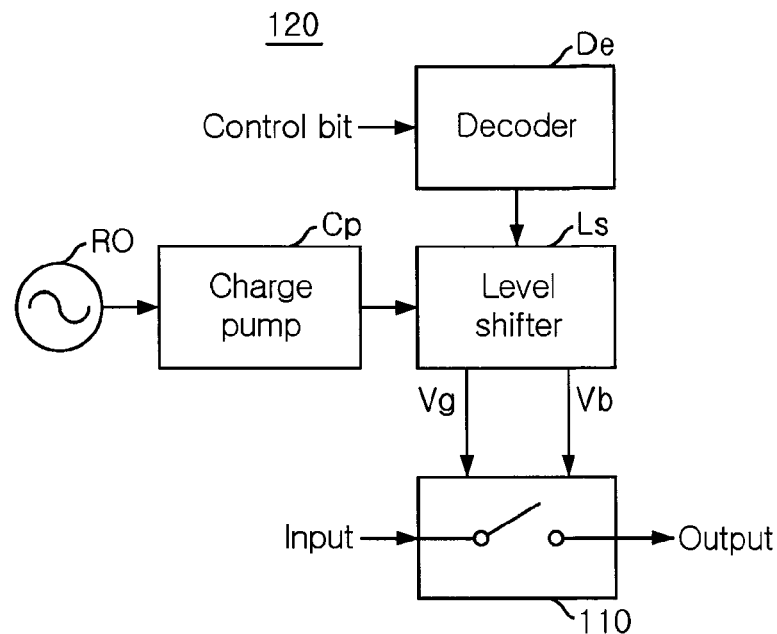
FIG. 4 is a view schematically showing the configuration of a limiter employed in the RF switch circuit according to an exemplary embodiment of the present invention.

FIG. 4 is a view schematically showing the configuration of a limiter employed in the RF switch circuit according to an exemplary embodiment of the present invention.

As shown in FIG. 4, the switch controller 120 may include an oscillator RO, a charge pump Cp, a decoder D3, and a level shifter Ls. The oscillator RO may be configured as a known current starved ring oscillator and provide a pre-set reference signal.

The charge pump Cp may convert a voltage level of the reference signal transferred from the oscillator RO into pre-set power.

The decoder De may receive control bits from an external source, decode the received control bits, and transfer the decoded bits to the level shifter Ls.

The level shifter Ls may provide power which has been converted by the charge pump Cp according to the control bits which have been decoded by the decoder De, to the RF switch 110.

The foregoing switch controller 120 includes the oscillator RO, the charge pump Cp, the decoder De, and the level shifter Ls. The oscillator RO, the charge pump Cp, the decoder De, and the level shifter Ls may be configured to include the at least one N type MOSFET 121 and the at least one P type MOSFET 122, respectively. Configuration of the oscillator RO, the charge pump Cp, the decoder De, and the level shifter Ls by including the N type MOSFET and the P type MOSFET are conventional technique, so a detailed description thereof will be omitted.

Accordingly, the switch controller 120 may be formed together with the RF switch 110 on the single chip substrate through the CMOS process, and because the floating resistors are connected with the corresponding terminals, even when the power level of an input signal is 30 dBm or higher, the linearity thereof can be maintained.

Meanwhile, the RF switch 110 and the switch controller 120 are formed on the single substrate, so the power level of an RF signal input to the RF switch 110 can be transferred to the switch controller 120 as indicated by the arrows.

Then, the power conversion operation of the charge pump Cp included in the switch controller 120 may become unstable.

Figure 5:
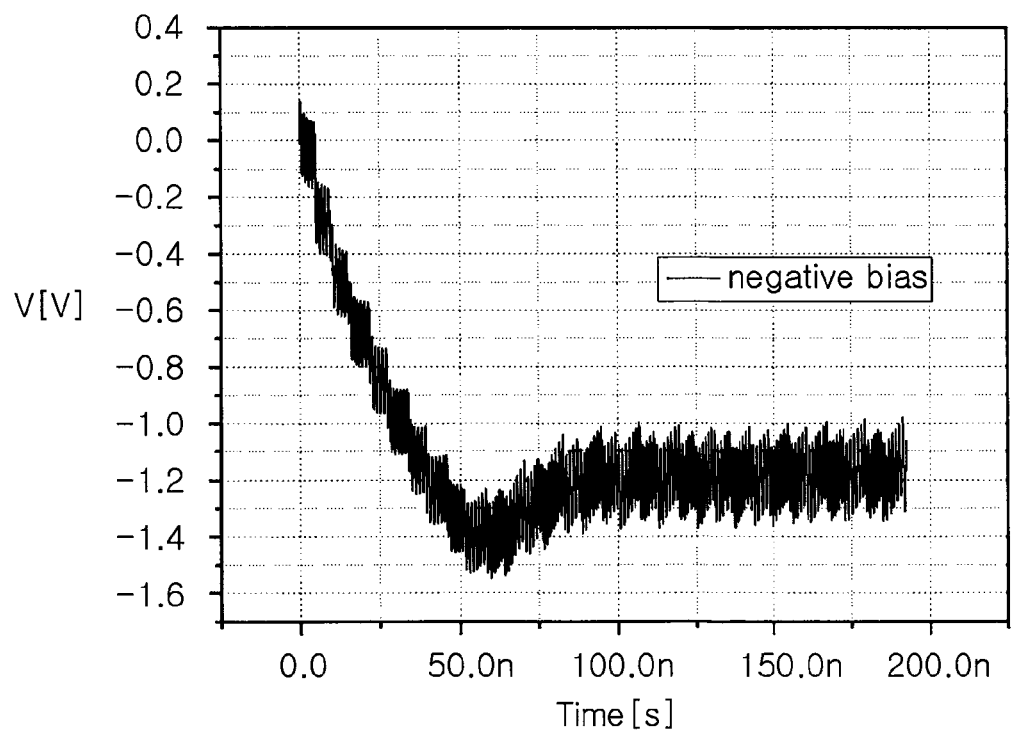
FIG. 5 is a graph showing electrical characteristics of a charge pump generated according to a power level of an input signal.

FIG. 5 is a graph showing the electrical characteristics of the charge pump generated according to a power level of an input signal.

As shown in FIG. 5, it is noted that, when a power level of an input signal is 35 dBm or higher, the output of −1.85V supplied from the charge pump becomes unstable.

Thus, in order to solve the problem, the limiter may be employed in the RF switch circuit according to an exemplary embodiment of the present invention.

Figure 6:
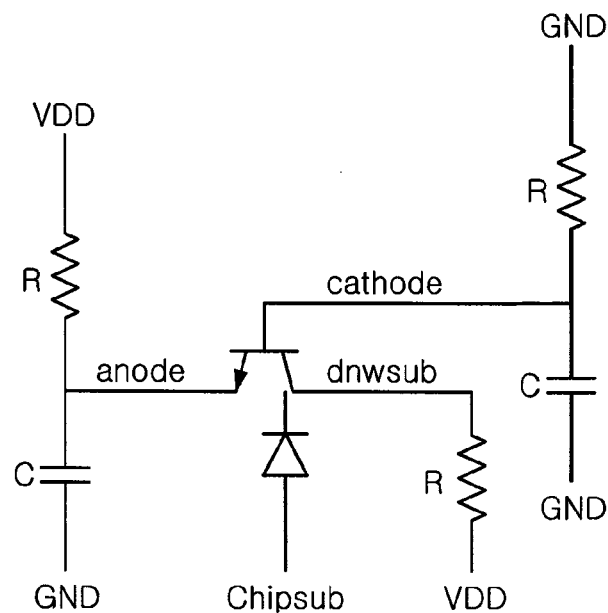
FIG. 6 is a view schematically showing the configuration of a limiter employed in the RF switch circuit according to an exemplary embodiment of the present invention.

FIG. 6 is a view schematically showing the configuration of a limiter employed in the RF switch circuit according to an exemplary embodiment of the present invention.

With reference to FIG. 6, the limiter 130 employed in the RF switch circuit according to an exemplary embodiment of the present invention may include the deep N type well diode. As shown in FIG. 1, a cathode of the deep N type well diode is connected with the first floating resistor R1 and the first capacitor C1, and the first floating resistor R1 and the first capacitor C1 may be connected with the ground Gnd. An anode of the deep N type well diode is connected with the second floating resistor R2 and the second capacitor C2. The second floating resistor R2 may receive the driving power Vdd, and the second capacitor C2 may be connected with the ground Gnd.

Figure 7:
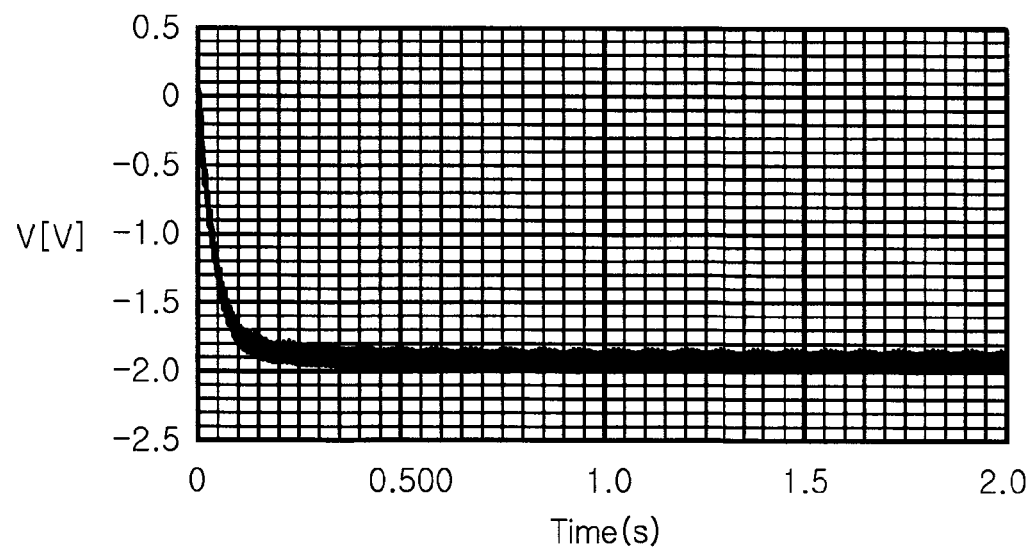
FIG. 7 is a graph showing electrical characteristics of the charge pump according to an exemplary embodiment of the present invention.

FIG. 7 is a graph showing the electrical characteristics of the charge pump according to an exemplary embodiment of the present invention.

With reference to FIG. 7, the charge pump employed in an exemplary embodiment of the present invention may operate stably even when an input signal having a high power level is input thereto.

FIGS. 8 to 11 are graphs showing the electrical characteristics of the RF switch circuit according to an exemplary embodiment of the present invention.

Figure 8:
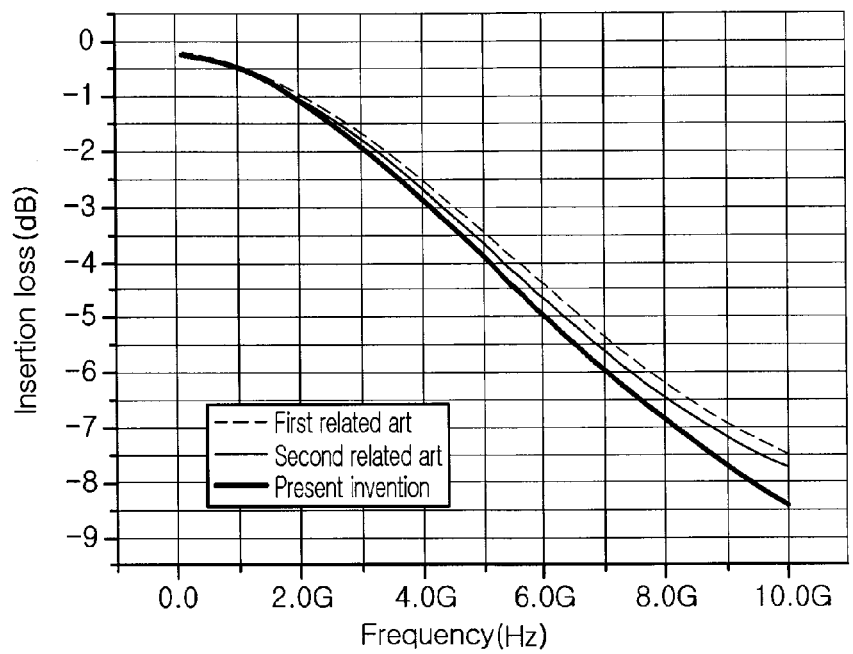
FIGS. 8 to 11 are graphs showing electrical characteristics of the RF switch circuit according to an exemplary embodiment of the present invention.
Figure 9:
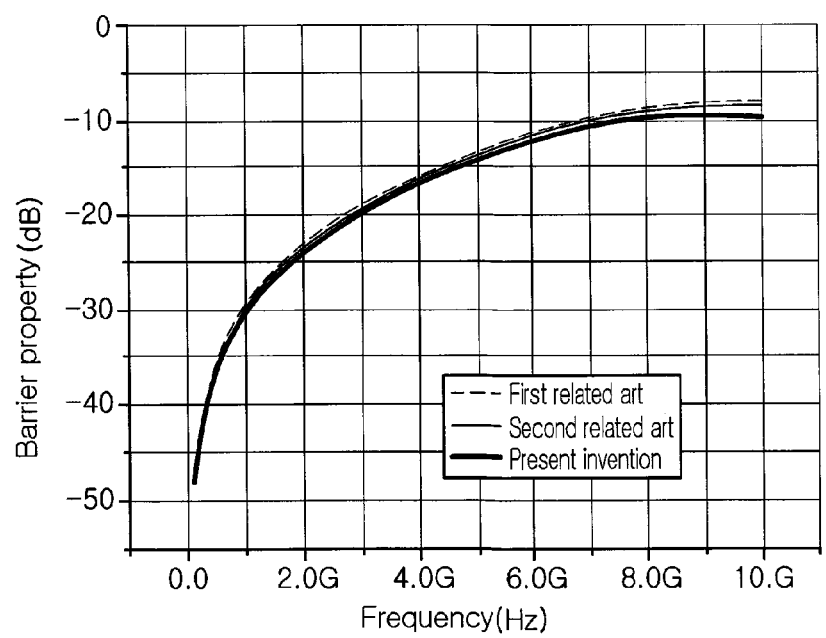

As shown in FIGS. 8 and 9, compared with the first and second related arts, there is not much change in an insertion loss and barrier properties of the RF switch circuit according to an exemplar embodiment of the present invention. Here, in the first related art, only the RF switch is connected with a floating resistor, and in the second related art, floating resistors are connected with the RF switch and the switch controller, respectively.

Figure 10:
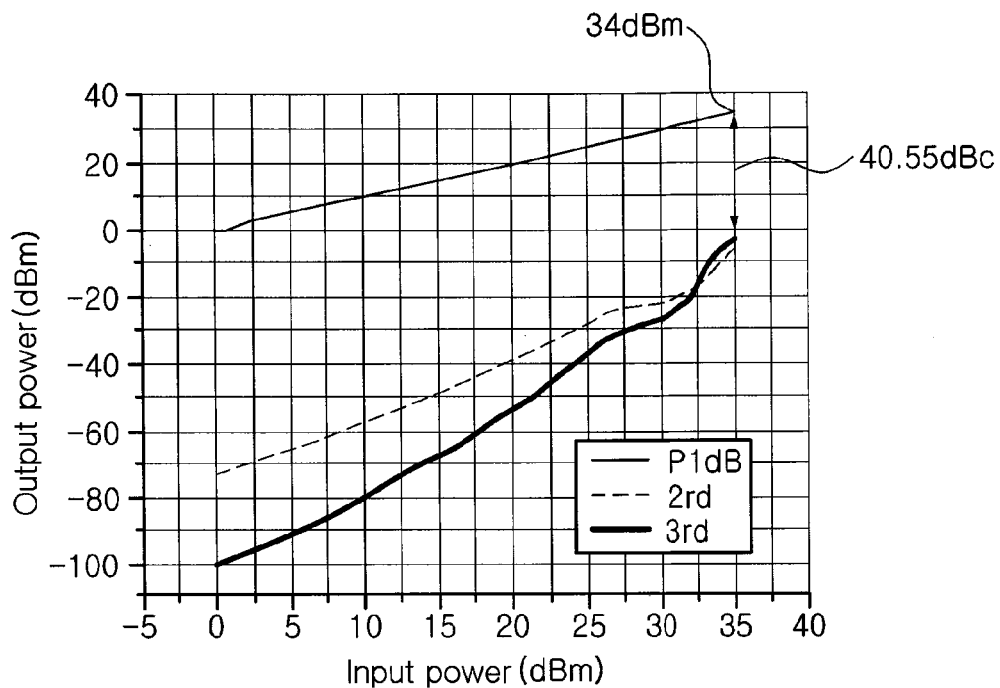
Figure 11:
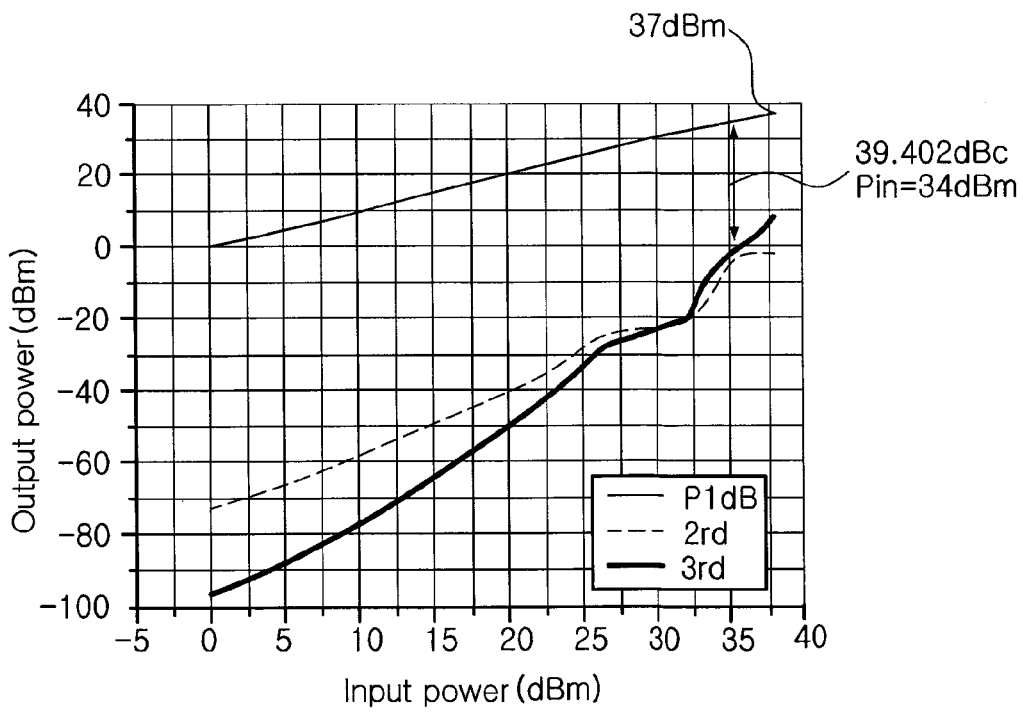

Meanwhile, with reference to FIG. 10, in the second related art, P1dB at an input signal of 35 dBm is 34 dBm, but with reference to FIG. 11, with the RF switch circuit according to an exemplary embodiment of the present invention, P1dB is not saturated at the input signal of 35 dBm and achieves 37 dBm even at an input signal of 38 dBm, marking an increase of 3 dBm as compared with the second related art.

In this manner, in the exemplary embodiment of the present invention, the power level of an input signal transferred to the switch controller through the substrate is controlled without degrading the insertion loss and barrier properties of the RF switch circuit, thereby extending a level range of the input signal and performing a stable operation even with the input signal having a high power level.

As set forth above, according to exemplary embodiments of the invention, when floating resistors are connected to an NMOS FET and a PMOS FET of the RF switch and those of the switch controller formed through a standard CMOS (Complementary Metal Oxide Semiconductor) process, an input signal input to the RF switch is restrained from being transferred to the switch controller. Thus, even when an input signal having a high power level is transferred, the switch controller can perform a stable operation.

While the present invention has been shown and described in connection with the exemplary embodiments, it will be apparent to those skilled in the art that modifications and variations can be made without departing from the spirit and scope of the invention as defined by the appended claims.

What is claimed is:
1. A radio frequency (RF) switch circuit, comprising:
an RF switch including at least one first N type metal oxide semiconductor (NMOS) switch formed on a single chip substrate, the RF switch configured to change a transmission path of an RF signal;
a switch controller including at least one second NMOS switch and at least one P type metal oxide semiconduc- tor (PMOS) switch formed on the chip substrate, the switch controller configured to control the RF switch; and a limiter including a deep N type well diode formed on the chip substrate, the limiter configured to limit a level of the RF signal transferred from the RF switch to the switch controller through the chip substrate, wherein the at least one first NMOS switch, the at least one second NMOS switch, and the at least one PMOS switch are configured to receive respective driving powers through floating resistors, respectively, the at least one first NMOS switch comprises
- a first N type terminal formed on a first deep N type well substrate formed on the chip substrate, the first N type terminal configured to receive the driving power through a first floating resistor,
- a first P type terminal configured to receive a body power through a second floating resistor, and
- two second N type terminals configured to receive a gate power through a third floating resistor, and the first P type terminal and the two second N type terminals are formed on a first P type substrate formed on the first deep N type well substrate.

2. The RF switch circuit of claim 1, wherein the at least one second NMOS switch comprises
- a third N type terminal formed on a second deep N type well substrate formed on the chip substrate, the third N type terminal configured to receive the driving power through a fourth floating resistor, and
- a second P type terminal and two fourth N type terminals formed on a second P type substrate formed on the second deep N type well substrate, and the at least one PMOS switch comprises
- two third P type terminals formed on the first N type substrate formed on the chip substrate, and
- a fifth N type terminal configured to receive the driving power through a fifth floating resistor.

3. The RF switch circuit of claim 2, wherein the deep N type well diode of the limiter comprises a sixth N type terminal formed on a third deep N type well substrate formed on the chip substrate, the sixth N type terminal configured to receive a driving power through a sixth floating resistor, a fourth P type terminal formed on a third P type substrate formed on the third deep N type well substrate, the fourth P type terminal connected with a ground through a seventh floating resistor, and a first capacitor connected in parallel with the seventh floating resistor, and a seventh N type terminal formed on the third P type substrate formed on the third deep N type well substrate, the seventh N type terminal configured to receive a driving power through an eighth floating resistor, and a second capacitor connected between the eighth floating resistor and the ground.

4. The RF switch circuit of claim 2, wherein
the switch controller comprises:
- an oscillator configured to provide a reference signal;
- a charge pump configured to convert a voltage level of the reference signal transferred from the oscillator;
- a decoder configured to decode a control bit from an external source; and
- a level shifter configured to shift the voltage level converted by the charge pump according to the decoded control bit from the decoder and to provide a level-shifted voltage to the RF switch, and each of the oscillator, the charge pump, the decoder, and the level shifter comprises the at least one second NMOS switch and the at least one PMOS switch.

5. The RF switch circuit of claim 1, wherein the at least one second NMOS switch is an N-channel metal oxide semiconductor field effect transistor (MOSFET) formed through a standard PMOS process.

6. The RF switch circuit of claim 1, wherein the at least one second NMOS switch and the at least one PMOS switch are an N-channel MOSFET and a P-channel MOSFET formed through a standard complementary metal oxide semiconductor (CMOS) process, respectively.

7. The RF switch circuit of claim 1, wherein the deep N type well diode of the limiter is formed through the standard CMOS process.

* * * * *